United States Patent
Liu et al.

(10) Patent No.: US 11,518,935 B2
(45) Date of Patent: Dec. 6, 2022

(54) NITRIDE FLUORESCENT MATERIAL AND LIGHT-EMITTING DEVICE CONTAINING SAME

(71) Applicants: GRIREM ADVANCED MATERIALS CO., LTD., Beijing (CN); GUOKE RE ADVANCED MATERIALS CO., LTD., Langfang (CN)

(72) Inventors: Ronghui Liu, Beijing (CN); Yuanhong Liu, Beijing (CN); Lei Chen, Beijing (CN); Ze Jiang, Beijing (CN); Lengleng Shao, Beijing (CN)

(73) Assignees: GRIREM ADVANCED MATERIALS CO., LTD., Beijing (CN); GUOKE RE ADVANCED MATERIALS CO., LTD., Langfang (CN)

( * ) Notice: Subject to any disclaimer, the term of this patent is extended or adjusted under 35 U.S.C. 154(b) by 341 days.

(21) Appl. No.: 16/612,327

(22) PCT Filed: Sep. 13, 2018

(86) PCT No.: PCT/CN2018/105574
§ 371 (c)(1),
(2) Date: Nov. 8, 2019

(87) PCT Pub. No.: WO2019/062557
PCT Pub. Date: Apr. 4, 2019

(65) Prior Publication Data
US 2021/0139775 A1 May 13, 2021

(30) Foreign Application Priority Data
Sep. 30, 2017 (CN) .......................... 201710919406.3

(51) Int. Cl.
C09K 11/79 (2006.01)
C09K 11/80 (2006.01)
(Continued)

(52) U.S. Cl.
CPC .... C09K 11/77928 (2021.01); C01B 21/0602 (2013.01); C09K 11/0883 (2013.01);
(Continued)

(58) Field of Classification Search
CPC .......... C09K 11/77928; C09K 11/7792; C09K 11/77348; C09K 11/7734;
(Continued)

(56) References Cited

U.S. PATENT DOCUMENTS

2008/0203901 A1* 8/2008 Bukesov ............ C09K 11/7731
252/301.36

FOREIGN PATENT DOCUMENTS

CN 1918262 A 2/2007
CN 101063228 A 10/2007
(Continued)

OTHER PUBLICATIONS

International Search Report of PCT/CN2018/105574.
Written Opinion of PCT/CN2018/105574.

*Primary Examiner* — Christopher M Raabe
(74) *Attorney, Agent, or Firm* — Dragon Sun Law Firm, PC; Jinggao Li; Nathaniel Perkins

(57) ABSTRACT

The present invention belongs to the technical field of inorganic luminescent materials, particularly relates to a nitride fluorescent material, and further discloses a light-emitting device containing such a fluorescent material. The nitride fluorescent material contains a compound with a structure like $M_mAl_xSi_yN_3$: aR, bEu, cCe. The fluorescent material has very high physical stability and chemical stability, and the fluorescent material is better in crystallization, and thus has relatively high external quantum efficiency. When being applied to a light-emitting device, the fluorescent material can fully exert the advantages of good stability and high external quantum efficiency, and the light-emitting (Continued)

efficiency and stability of the light-emitting device can be further improved.

20 Claims, 1 Drawing Sheet

(51) Int. Cl.
  *C09K 11/77* (2006.01)
  *C01B 21/06* (2006.01)
  *C09K 11/08* (2006.01)
  *H01L 33/50* (2010.01)
(52) U.S. Cl.
  CPC .. *C09K 11/77068* (2021.01); *C09K 11/77348* (2021.01); *C09K 11/77748* (2021.01); *H01L 33/502* (2013.01); *C01P 2002/52* (2013.01)
(58) Field of Classification Search
  CPC .......... C09K 11/77068; C09K 11/7706; C09K 11/77748; C09K 11/7774; H01L 33/502
  USPC .......................................................... 257/98
  See application file for complete search history.

(56) References Cited

FOREIGN PATENT DOCUMENTS

| CN | 101628711 A | * | 1/2010 | ......... C01B 21/0602 |
|---|---|---|---|---|
| CN | 105226121 A | | 1/2016 | |
| CN | 105305952 A | | 2/2016 | |
| CN | 105733580 A | | 7/2016 | |

* cited by examiner

NITRIDE FLUORESCENT MATERIAL AND LIGHT-EMITTING DEVICE CONTAINING SAME

CROSS-REFERENCE TO RELATED APPLICATIONS

This application is a national stage application of PCT Application No. PCT/CN2018/105574. This Application claims priority from PCT Application No. PCT/CN2018/105574 filed Sep. 13, 2018 and CN 201710919406.3 filed Sep. 30, 2017, the contents of which are incorporated herein in the entirety by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

TECHNICAL FIELD

The present invention belongs to the technical field of inorganic luminescent materials, particularly relates to a nitride fluorescent material, and further discloses a light-emitting device containing such a fluorescent material.

BACKGROUND

Near-infrared light refers to the light with a wavelength in the range of 700-1500 nm. The waveband spectrum has great application prospects in the fields such as optical fiber communication, biological imaging and signal conversion and amplification, and has become a hot research topic at home and abroad.

The existing near-infrared fluorescent material substrate mainly adopts a rare earth metal oxide having a garnet structure like those disclosed in patents CN101063228A and CN105733580A, or the electroluminescent organic complex (Chem.-Eur. J., 2012, 18, 1961-1968; Adv. Mater., 2009, 21, 111-116; Chem. Commun., 2011, 14, 1833-1837; Adv. Funct. Mater., 2009, 19, 2639-2647). However, these known fluorescent materials have the defects such as poor stability and low light-emitting efficiency, which limits the application of such devices in the above application fields. In addition, since the common near-infrared light-emitting devices in the prior art basically adopt infrared chips, the problems that the excitation efficiency is low and the cost is relatively high also exist.

Therefore, it is necessary to research and develop a new fluorescent material to overcome the above defects.

SUMMARY

To this end, the technical problem to be solved by the present invention is to provide a high-brightness and high-stability nitride fluorescent material to solve the problem of low light-emitting efficiency of fluorescent materials in the prior art.

The second technical problem to be solved by the present invention is to provide a light-emitting device containing the fluorescent material to solve the problems of poor stability and low light-emitting efficiency of light-emitting devices in the prior art.

In order to solve the above technical problems, the present invention provides a nitride fluorescent material. The fluorescent material contains a compound with the chemical formula $M_m Al_x Si_y N_3$: aR, bEu, cCe, wherein the M element is selected from Ca element and/or Sr element; the R element is selected from at least one of Er element, Nd element, Yb element, Cr element, and Fe element; and the parameters m, x, y, a, b and c meet the following relationships: $0.8 \leq m \leq 1.0$, $0.9 \leq x \leq 1.1$, $0.9 \leq y \leq 1.1$, $0.001 \leq a \leq 0.20$, $0 \leq b \leq 0.20$ and $0 \leq c \leq 0.1$.

Preferably, the fluorescent material has the same crystal structure as $CaAlSiN_3$.

More preferably, in the nitride fluorescent material, the M element is the Ca element and Sr element, and a molar ratio of the Ca element to the M element is not less than 0.8.

Preferably, in the above chemical formula of the fluorescent material, the parameters b and c meet the following relationships: $0.001 \leq b \leq 0.10$ and $0.001 \leq c \leq 0.05$.

Preferably, in the above chemical formula of the fluorescent material, $3 \leq b/c \leq 6$.

Preferably, in the above chemical formula of the fluorescent material, the parameters x and y meet the following relationship: $1 \leq y/x \leq 1.3$.

Most preferably, in the nitride fluorescent material, the M element is the Ca element and the R element is the Er element.

The nitride fluorescent material provided by the present invention can emit near-infrared light under the excitation of a radiation source such as an ultraviolet light chip and a blue light chip. In addition, the material has better light-emitting efficiency, can also greatly reduce the cost, and can be used in the fields such as optical fiber communication, biological imaging, signal conversion and amplification, and component analysis.

The present invention provides a light-emitting device, at least comprising the nitride fluorescent material and an excitation light source.

Preferably, the emission wavelength of the excitation light source is 360-480 nm.

Preferably, the excitation light source is an ultraviolet/near-ultraviolet semiconductor chip or a blue light semiconductor chip.

More preferably, the excitation light source is an ultraviolet/near-ultraviolet semiconductor chip with an emission wavelength in the range of 390-430 nm, or the excitation light source is a blue light semiconductor chip with an emission wavelength in the range of 430-470 nm.

The nitride fluorescent material according to the present invention contains a compound with the structure like $M_m Al_x Si_y N_3$: aR, bEu, cCe. The fluorescent material has very high physical stability and chemical stability, and the fluorescent material is better in crystallization, and thus has relatively high external quantum efficiency. When being applied to the light-emitting device, the fluorescent material can fully exert the advantages of the good stability and high external quantum efficiency, and the light-emitting efficiency and stability of the light-emitting device can be further improved. In addition, different rare earth ions or the combinations of the rare earth ions are selected to achieve the adjustability and controllability of the intensity and position of an emission peak, so as to improve the luminescent properties. Based on the characteristics of the above nitride fluorescent material, the fluorescent material and the light-emitting device have an excellent application prospect in the fields such as optical fiber communication, biological imaging, signal conversion and amplification and component analysis.

Therefore, a heretofore unaddressed need exists in the art to address the aforementioned deficiencies and inadequacies.

BRIEF DESCRIPTION OF THE DRAWINGS

In order to enable the content of the present invention to be more clearly understood, the present invention will be further described in detail below according to the specific embodiments of the present invention in combination with the accompanying drawings.

DETAILED DESCRIPTION

Embodiment 1

The embodiments and implementation manners of the present invention are as follows, and are merely intended to illustrate a nitride fluorescent material and a light-emitting device containing the same according to the present invention, but the present invention is not limited to these embodiments and implementation manners.

Embodiment 1

According to the nitride fluorescent material of the present embodiment, after analysis, the chemical formula of the fluorescent material is $Ca_{0.963}N_3$:0.03Er, 0.006Eu.

According to the nitride fluorescent material of the present embodiment, $Ca_3N_2$, AlN, $Si_3N_4$, EuN and $ErF_3$ are taken as raw materials. The raw materials are accurately weighed in a glove box according to a stoichiometric ratio of the component $Ca_{0.963}AlSiN_3$:0.03Er, 0.006 Eu. The raw materials are put into a mixing tank and mixed on a mixer for 30 minutes, and then taken out and sieved. The mixed raw materials are calcined at 1750° C. for 10 h in a nitrogen atmosphere to obtain a calcined product, and the calcined product is crushed, sieved, washed, enveloped and dried to obtain the desired fluorescent material.

Figure 1:
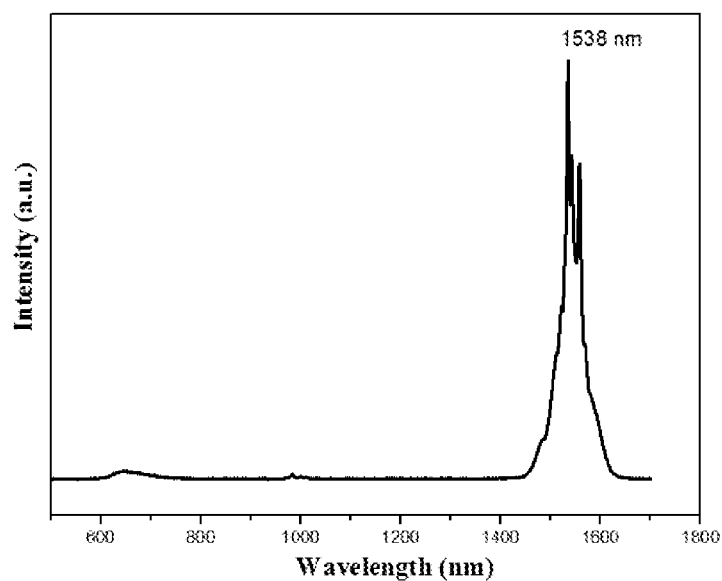
FIG. 1 is an emission spectrum diagram of a fluorescent material prepared in Embodiment 1 under the excitation of a blue light source at 460 nm.

According to the light-emitting device encapsulated by the fluorescent material, the wavelength of the excitation source semiconductor chip is 460 nm, and the emission spectrum is shown in FIG. 1. As can be seen from FIG. 1, the highest peak wavelength of the emission spectrum is 1538 nm.

Figure 2:
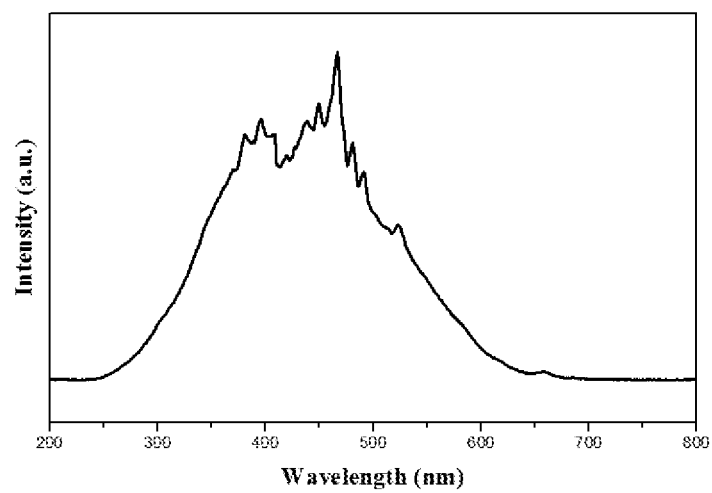
FIG. 2 is an excitation spectrum of a fluorescent material prepared in Embodiment 1 at a monitoring wavelength of 1538 nm.

The excitation spectrum of the fluorescent material is as shown in FIG. 2, the monitoring wavelength thereof is 1538 nm, and the relative intensity thereof is 155%. As can be seen from FIG. 2, the fluorescent material can be effectively excited in the range of 250-600 nm, and for example, can be excited by near-ultraviolet light, blue light and red light, and has a wide range of use.

As can be seen from the results of FIG. 1 and FIG. 2, the fluorescent material prepared in the present embodiment is a near-infrared fluorescent material which can be excited by visible light.

Embodiment 2

According to the nitride fluorescent material of the present embodiment, after analysis, the chemical formula of the fluorescent material is $(Ca_{0.15}, Sr_{0.81})AlSiN_3$:0.01 Er, 0.02 Eu.

According to the nitride fluorescent material of the present embodiment, $Ca_3N_2$, $Sr_2N$, AlN, $Si_3N_4$, EuN and $ErF_3$ are taken as raw materials. The raw materials are accurately weighed in a glove box according to a stoichiometric ratio of the component $(Ca_{0.15}, Sr_{0.81})AlSiN_3$:0.01 Er, 0.02 Eu. The raw materials are put into a mixing tank and mixed on a mixer for 30 minutes, and then taken out and sieved. The mixed raw materials are calcined at 1800° C. for 15 h in a nitrogen atmosphere to obtain a calcined product, and the calcined product is crushed, sieved, washed, enveloped and dried to obtain the desired fluorescent material. Under the excitation at 405 nm, the emission spectrum of the prepared fluorescent material has the highest peak wavelength of 1538 nm and a relative intensity of 117% by measurement.

Embodiment 3

According to the nitride fluorescent material of the present embodiment, after analysis, the chemical formula of the fluorescent material is $Ca_{0.953}AlSiN_3$:0.007 Eu, 0.03 Er, 0.01 Ce.

According to the nitride fluorescent material of the present embodiment, $Ca_3N_2$, $Sr_2N$, AlN, $Si_3N_4$, EuN, $ErF_3$ and $CeO_2$ are taken as raw materials. The raw materials are accurately weighed in a glove box according to a stoichiometric ratio of the component $Ca_{0.953}AlSiN_3$:0.007Eu, 0.03Er, 0.01Ce. The raw materials are put into a mixing tank and mixed on a mixer for 50 minutes, and then taken out and sieved. The mixed raw materials are calcined at 1700° C. for 24 h in a nitrogen atmosphere to obtain a calcined product, and the calcined product is crushed, sieved, washed, enveloped and dried to obtain the desired fluorescent material.

After measurement, under the excitation of a semiconductor chip at 405 nm, the emission spectrum of the fluorescent material has the highest peak wavelength of 1538 nm and a relative intensity of 160%.

Embodiment 4

According to the nitride fluorescent material of the present embodiment, after analysis, the chemical formula of the fluorescent material is $Ca_{0.953}AlSiN_3$:0.05Yb, 0.06Cr.

According to the nitride fluorescent material of the present embodiment, $Ca_3N_2$, AlN, $Si_3N_4$, $Yb_2O_3$ and $Cr_2O_3$ are taken as raw materials. The raw materials are accurately weighed in a glove box according to a stoichiometric ratio of the component $Ca_{0.899}AlSiN_3$:0.05Yb, 0.06Cr. The raw materials are put into a mixing tank and mixed on a mixer for 30 minutes, and then taken out and sieved. The mixed raw materials are calcined at 1750° C. for 10 h in a nitrogen atmosphere to obtain a calcined product, and the calcined product is crushed, sieved, washed, enveloped and dried to obtain the desired fluorescent material.

By measurement, under the excitation of a semiconductor chip at 455 nm, the emission spectrum of the fluorescent material is a broadband emission spectrum, the emission peaks are at 994 nm and 1278 nm and correspond to the emission peaks of $Cr^{3+}$ and $Yb^{3+}$ respectively, and the emission spectrum has the highest peak wavelength of 1278 nm and the relative intensity of 109%.

Embodiments 5 to 22

According to the nitride fluorescent materials of the following Embodiments 5 to 22, $Ca_3N_2$, $Sr_2N$, $AlN$, $Si_3N_4$, $EuN$, $CeO_2$, $Nd_2O_3$ and $Fe_2O_3$ are accurately weighed in a glove box according to the stoichiometric ratios in the formulas of Embodiments 5 to 22 shown in Table 1 below. The above raw materials are put into a mixing tank and mixed on a mixer for 5 h, and then taken out and sieved. The mixed raw materials are calcined at 1800° C. for 13 h in a nitrogen atmosphere to obtain a calcined product, and the calcined product is crushed, sieved, washed, enveloped and dried to obtain the samples with the chemical formulas of Embodiments 5 to 22.

The nitride fluorescent materials of Embodiments 1 to 22 are separately taken for testing of optical properties. Under the excitation at 460 nm, the infrared region relative intensities of the nitride fluorescent materials of Embodiment 5-22 are as shown in Table 1, and are calculated by taking the luminous intensity of $Y_{2.92}Al_5O_{12}:0.04Ce, 0.04Nd$ in the prior art as 100.

TABLE 1

Chemical formulas and relative intensities of the nitride fluorescent materials synthesized in Embodiments 1 to 22

| | Chemical formula of luminescent material | Relative intensity |
|---|---|---|
| Comparative example | $Y_{2.92}Al_5O_{12}:0.04Ce, 0.04Nd$ | 100% |
| Embodiment 1 | $Ca_{0.963}AlSiN_3:0.03Er, 0.006Eu$ | 155% |
| Embodiment 2 | $(Ca_{0.15}, Sr_{0.81})AlSiN_3:0.01Er, 0.02Eu$ | 117% |
| Embodiment 3 | $Ca_{0.953}AlSiN_3:0.007Eu, 0.03Er, 0.01Ce$ | 160% |
| Embodiment 4 | $Ca_{0.899}AlSiN_3:0.05Yb, 0.06Cr$ | 109% |
| Embodiment 5 | $CaAl_{0.9}Si_{0.9}N_3:0.001Yb, 0.2Eu, 0.099Ce$ | 119% |
| Embodiment 6 | $Ca_{0.8}Al_{0.999}Si_{1.09}N_3:0.001Nd, 0.01Eu$ | 121% |
| Embodiment 7 | $Ca_{0.99}Al_{0.999}SiN_3:0.001Yb, 0.01Eu$ | 124% |
| Embodiment 8 | $CaAl_{0.999}Si_{0.995}N_3:0.001Cr, 0.01Eu$ | 116% |
| Embodiment 9 | $Ca_{0.8}AlSi_{0.945}N_3:0.2Fe, 0.01Eu$ | 115% |
| Embodiment 10 | $Ca_{0.805}AlSiN_3:0.03Er, 0.15Eu$ | 114% |
| Embodiment 11 | $Ca_{0.953}Al_{0.9961}Si_{0.9998}N_3:0.03Er, 0.006Eu, 0.0015Ce$ | 166% |
| Embodiment 12 | $Ca_{0.155}Sr_{0.81}Al_{1.1}Si_{0.9}N_3:0.03Er, 0.04Eu$ | 103% |
| Embodiment 13 | $Sr_{0.949}AlSiN_3:0.03Er, 0.006Eu$ | 105% |
| Embodiment 14 | $Ca_{0.9885}AlSiN_3:0.001Er, 0.01Eu$ | 132% |
| Embodiment 15 | $Ca_{0.9485}Al_{0.9}Si_{1.1}N_3:0.001Nd, 0.001Er, 0.001Yb$ | 113% |
| Embodiment 16 | $Ca_{0.805}AlSi_{1.04}N_3:0.03Er, 0.1Eu$ | 131% |
| Embodiment 17 | $Ca_{0.954}AlSiN_3:0.03Er, 0.001Eu$ | 135% |
| Embodiment 18 | $Ca_{0.9665}Al_{0.95}SiN_3:0.04Er, 0.003Eu, 0.001Ce$ | 162% |
| Embodiment 19 | $Ca_{0.954}Al_{0.95}SiN_3:0.03Er, 0.001Eu, 0.05Ce$ | 136% |
| Embodiment 20 | $Ca_{0.9685}Al_{0.95}SiN_3:0.04Er, 0.001Eu, 0.001Ce$ | 157% |
| Embodiment 21 | $Ca_{0.954}Al_{0.9}SiN_3:0.03Er, 0.001Eu, 0.1Ce$ | 138% |
| Embodiment 22 | $Ca_{0.9635}Al_{0.95}SiN_3:0.04Er, 0.006Eu, 0.001Ce$ | 164% |

It can be seen that the nitride fluorescent material according to the present invention has higher luminous intensity and luminous properties.

It is apparent that the above embodiments are merely examples for clear description, instead of limiting the implementation manners. Other variations or modifications of the various forms may also be made by those ordinary skilled in the art based on the above description. There is no need and no way to exhaust all of the embodiments, and obvious changes or variations resulting therefrom are still within the scope of the present invention.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A nitride fluorescent material, wherein the fluorescent material contains a compound with the chemical formula $M_mAl_xSi_yN_3$: aR, bEu, cCe, wherein
   the M element is selected from Ca element and/or Sr element;
   the R element is selected from at least one of Er element, Nd element, Yb element, Cr element, and Fe element; and
   the parameters m, x, y, a, b, and c meet the following relationships: $0.8 \leq m \leq 1.0$, $0.9 \leq x \leq 1.1$, $0.9 \leq y \leq 1.1$, $0.001 \leq a \leq 0.20$, $0 \leq b \leq 0.20$ and $0 \leq c \leq 0.1$;
   the parameters b and c meet the following relationship: $3 \leq b/c \leq 6$.

2. The nitride fluorescent material according to claim 1, wherein the fluorescent material has the same crystal structure as $CaAlSiN_3$.

3. The nitride fluorescent material according to claim 1, wherein the M element is the Ca element and Sr element, and a molar ratio of the Ca element to the M element is not less than 0.8.

4. The nitride fluorescent material according to claim 1, wherein the parameters b and c meet the following relationships: $0.001 \leq b \leq 0.10$ and $0.001 \leq c \leq 0.05$.

5. The nitride fluorescent material according to claim 1, wherein the parameters x and y meets the following relationship: $1 \leq y/x \leq 1.3$.

6. The nitride fluorescent material according to claim 1, wherein the M element is the Ca element and the R element is the Er element.

7. A light-emitting device, at least comprising the nitride fluorescent material according to claim 1 and an excitation light source.

8. The light-emitting device according to claim 7, wherein the emission wavelength of the excitation light source is 360-480 nm.

9. The light-emitting device according to claim 8, wherein the excitation light source is an ultraviolet/near-ultraviolet semiconductor chip or a blue light semiconductor chip.

10. The light-emitting device according to claim 7, wherein the excitation light source is an ultraviolet/near-ultraviolet semiconductor chip with an emission wavelength in the range of 390-430 nm, or the excitation light source is a blue light semiconductor chip with an emission wavelength in the range of 430-470 nm.

11. The nitride fluorescent material according to claim 2, wherein the M element is the Ca element and Sr element, and a molar ratio of the Ca element to the M element is not less than 0.8.

12. The nitride fluorescent material according to claim 2, wherein the parameters b and c meet the following relationships: $0.001 \leq b \leq 0.10$ and $0.001 \leq c \leq 0.05$.

13. The nitride fluorescent material according to claim 3, wherein the parameters b and c meet the following relationships: $0.001 \leq b \leq 0.10$ and $0.001 \leq c \leq 0.05$.

14. The nitride fluorescent material according to claim 2, wherein the parameters x and y meets the following relationship: $1 \leq y/x \leq 1.3$.

15. The nitride fluorescent material according to claim 3, wherein the parameters x and y meets the following relationship: $1 \leq y/x \leq 1.3$.

16. The nitride fluorescent material according to claim 4, wherein the parameters x and y meets the following relationship: $1 \leq y/x \leq 1.3$.

17. The nitride fluorescent material according to claim 2, wherein the M element is the Ca element and the R element is the Er element.

18. The nitride fluorescent material according to claim 3, wherein the M element is the Ca element and the R element is the Er element.

19. The nitride fluorescent material according to claim 4, wherein the M element is the Ca element and the R element is the Er element.

20. The nitride fluorescent material according to claim 5, wherein the M element is the Ca element and the R element is the Er element.

* * * * *